United States Patent
Sandhu et al.

(10) Patent No.: US 8,673,787 B2
(45) Date of Patent: *Mar. 18, 2014

(54) METHOD TO REDUCE CHARGE BUILDUP DURING HIGH ASPECT RATIO CONTACT ETCH

(75) Inventors: Gurtej S. Sandhu, Boise, ID (US); Max F. Hineman, Boise, ID (US); Daniel A. Steckert, Boise, ID (US); Jingyi Bai, Boise, ID (US); Shane J. Trapp, Boise, ID (US); Tony Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 59 days.

This patent is subject to a terminal disclaimer.

(21) Appl. No.: 13/164,970

(22) Filed: Jun. 21, 2011

(65) Prior Publication Data

US 2011/0250759 A1 Oct. 13, 2011

Related U.S. Application Data

(63) Continuation of application No. 12/018,254, filed on Jan. 23, 2008, now Pat. No. 7,985,692, which is a continuation of application No. 11/213,283, filed on Aug. 26, 2005, now Pat. No. 7,344,975.

(51) Int. Cl.
*H01L 21/302* (2006.01)

(52) U.S. Cl.
USPC ........... 438/714; 438/672; 438/639; 438/717; 216/67

(58) Field of Classification Search
USPC ......... 438/640, 659, 700, 706, 710, 712, 714, 438/725, 735, 622, 634, 637, 672, 709, 438/723; 216/67, 72
See application file for complete search history.

(56) References Cited

U.S. PATENT DOCUMENTS

| | | | |
|---|---|---|---|
| 5,981,398 A | 11/1999 | Tsai et al. | |
| 6,228,774 B1 | 5/2001 | Marquez | |
| 6,440,640 B1 | 8/2002 | Yang et al. | |
| 6,573,030 B1 | 6/2003 | Fairbairn et al. | |
| 6,890,859 B1 * | 5/2005 | Bamnolker et al. | 438/700 |
| 7,033,954 B2 * | 4/2006 | Donohoe | 438/723 |
| 7,109,097 B2 * | 9/2006 | Paranjpe et al. | 438/510 |
| 7,218,506 B2 * | 5/2007 | Kobayashi et al. | 361/523 |
| 7,344,975 B2 | 3/2008 | Sandhu et al. | |
| 7,985,692 B2 * | 7/2011 | Sandhu et al. | 438/717 |

(Continued)

OTHER PUBLICATIONS

Soda et al., "On-Wafer Monitoring of Electrical conductivity of Sidewall-deposited Polymer in SiO2 Etching Processes", 2 pgs.

(Continued)

*Primary Examiner* — Lan Vinh
(74) *Attorney, Agent, or Firm* — Wells St. John, P.S.

(57) ABSTRACT

A method of high aspect ratio contact etching a substantially vertical contact hole in an oxide layer using a hard photoresist mask is described. The oxide layer is deposited on an underlying substrate. A plasma etching gas is formed from a carbon source gas. Dopants are mixed into the gas. The doped plasma etching gas etches a substantially vertical contact hole through the oxide layer by doping carbon chain polymers formed along the sidewalls of the contact holes during the etching process into a conductive state. The conductive state of the carbon chain polymers reduces the charge buildup along sidewalls to prevent twisting of the contact holes by bleeding off the charge and ensuring proper alignment with active area landing regions. The etching stops at the underlying substrate.

18 Claims, 3 Drawing Sheets

(56) References Cited

U.S. PATENT DOCUMENTS

| | | |
|---|---|---|
| 2002/0048953 A1 | 4/2002 | Nayak |
| 2003/0003755 A1 | 1/2003 | Donohoe |
| 2003/0101935 A1* | 6/2003 | Walther .................... 118/723 E |
| 2004/0097091 A1 | 5/2004 | Mouri et al. |
| 2007/0099375 A1* | 5/2007 | Kim et al. ..................... 438/238 |

OTHER PUBLICATIONS

Watanabe et al., "Reduction of Microtrenching and Island Formation in Oxide Plasma Etching by Employing Electron Beam Charge Neutralization", Applied Physics Letters, Oct. 22, 2001, pp. 2698-2700, vol. 79, No. 17, American Institute of Physics, USA.

* cited by examiner

METHOD TO REDUCE CHARGE BUILDUP DURING HIGH ASPECT RATIO CONTACT ETCH

RELATED PATENT DATA

This patent resulted from a continuation application of U.S. patent application Ser. No. 12/018,254, filed Jan. 23, 2008, entitled "Method to Reduce Charge Buildup During High Aspect Ratio Contact Etch", naming Gurtej S. Sandhu, Max F. Hineman, Daniel A. Steckert, Jingyi Bai, Shane J. Trapp, and Tony Schrock as inventors, which resulted from a continuation application of U.S. patent application Ser. No. 11/213,283, filed Aug. 26, 2005, entitled, "Method to Reduce Charge Buildup During High Aspect Ratio Contact Etch", naming Gurtej S. Sandhu, Max F. Hineman, Daniel A. Steckert, Jingyi Bai, Shane J. Trapp, and Tony Schrock as inventors, now U.S. Pat. No. 7,344,975, the disclosures of which are incorporated by reference.

BACKGROUND OF THE INVENTION

The present invention generally relates to High Aspect Ratio Contact trench etching and, in particular, relates to the reduction of charge buildup along the trench sidewalls during High Aspect Ratio Contact trench etching.

Successful construction of nano- and microstructures requires reliable and reproducible methods of production. One such nano- or microstructure is a contact hole, or trench. Contact hole structures are generally fabricated using wet (crystal anisotrophy) or dry plasma (ion-bombardment anisotrophy) etching. One example of a contact hole formed by dry plasma etching is shaped by etching through an oxide layer overlaying a silicon substrate using a hard photoresist mask deposited on top of the oxide layer, wherein the etching substantially stops on the underlying substrate layer. Contact holes have a diameter, also known as width, and a depth. The diameter is referred to as the feature size and tends to decrease with increasing circuit density. The aspect ratio is the ratio of depth to width and tends to increase as the width decreases. Modem integrated circuits are scaled with increasingly narrower design rules. In addition, as the width of the etched features decreases, the aspect ratio increases, necessitating a high aspect ratio contact trench etch process.

Therefore, high aspect ratio contact (HARC) trench etching is one of the key processes for forming contact hole interconnections. In typical plasma etching, positive ions are accelerated to the substrate by a radio frequency (RF) biased electrode sheath providing directionality for forming vertical contact hole profiles. The substrate layer is disposed on a chuck and placed within the gas chamber. The chuck acts as a bottom electrode and can be biased by a second RF power source. During plasma etching, plasma electrons, due to their random thermal motion, tend to impinge on the sidewalls near the top of the contact hole causing charge accumulation. Charge accumulation is one of the main causes of charge build-up damage, etching stop, as well as micro-loading effects.

Carbon chain polymers are a result of the plasma etching. Conductivity of the sidewalls in the contact holes increases during the etching processes resulting in carbon chain polymer buildup along the sidewalls of the contact hole. These deposited carbon chain polymers strongly affect the sidewall conductivity in the contact holes. The source of the carbon that form the carbon chain polymers may be from the hard photoresist mask, from the carbon source plasma etching gases, or from the oxide layer itself. Over the course of the etch process, the bottom of the contact hole charges positively while the sidewalls charge negatively, thereby creating undesired local electric fields within the contact hole.

During typical HARC etches, this charge buildup along the sidewalls of a narrow and deep opening can deflect the incoming ions causing changes in the trajectory of those ions. This, in turn, results in the contact hole twisting during its formation and becoming non-vertical. Further, sidewall charging may also lead to complete etch stoppage in HARC contact holes. Another related issue associated with the charge buildup along the sidewalls is that the contact hole misses the active area landing region in the underlying substrate due to the twisting of the contact hole during its formation. Therefore, it is important to produce vertically straight contact holes because straight sidewall profiles ensure that the subsequently deposited metal material can properly fill the etched feature and make suitable electrical contact with the active area landing region.

Therefore, there is a need for a method to reduce charge buildup along the carbon chain polymer which forms along the sidewalls of the contact holes during HARC etching in order to produce substantially vertical contact holes.

There is also a need for a method to produce substantially vertical contact holes without shutting off the etch component of the HARC etching.

In addition, there is a need for a method which increases the step coverage of the carbon chain polymer buildup along the sidewall in order to enable the charge buildup to bleed off.

BRIEF SUMMARY OF THE INVENTION

According to one embodiment of the present invention, a method of high aspect ratio contact etching is used to etch a substantially vertical contact hole in an oxide layer using a hard photoresist mask. The oxide layer is deposited on top of an underlying silicon layer. The hard photoresist layer is then deposited on the oxide layer. A plasma etching gas is formed from a carbon source gas. Dopants, in the form of atoms, molecules and/or ions, are mixed into the carbon source gas. The doped plasma etching gas etches a substantially vertical contact hole through the hard photoresist mask and oxide layers. The doped plasma etching gas dopes the carbon chain polymer formed and deposited along the sidewalls of the contact holes during the etching process into a conductive state. The conductive state of the carbon chain polymers reduces the charge buildup along sidewalls of the contact holes and ensuring proper alignment with active area landing regions to prevent twisting of the contact holes by bleeding off the charge. The etching is stopped at the underlying silicon layer.

Accordingly, it is a feature of embodiments of the present invention to introduce dopants into the plasma etching gas in order to prevent charge buildup along the sidewalls of vertical contact holes to avoid the twisting of the vertical contact holes during formation and to ensure proper alignment with active area landing regions. Other features of embodiments of the present invention will be apparent in light of the following detailed description of the invention and accompanying drawings.

Other features of embodiments of the present invention will be apparent in light of the following detailed description of the invention and accompanying drawings.

BRIEF DESCRIPTION OF THE SEVERAL VIEWS OF THE DRAWINGS

The following detailed description of specific embodiments of the present invention can be best understood when

DETAILED DESCRIPTION

In the following detailed description of the preferred embodiments, reference is made to the accompanying drawings that form a part hereof, and in which are shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Figure 1:
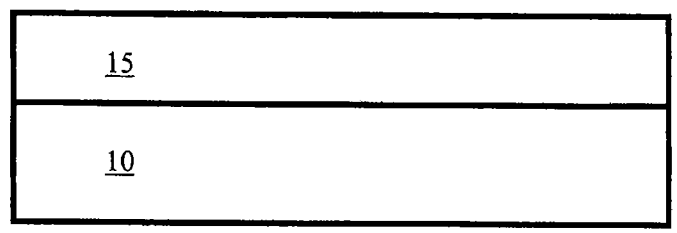
FIG. 1 illustrates a partially completed semiconductor device having portions of the silicon substrate covered with an oxide layer according to an embodiment of the present invention.

FIG. 1 illustrates a partially completed semiconductor device. The device comprises a substrate layer 10. An oxide layer 15 is deposited on top of the substrate layer 10. The substrate layer 10 is typically comprised of silicon, silicon oxide or any other suitable material known in the art. The oxide layer 15 can be comprised of borophosphosilicate (BPSG), tetraethylorthosilicate (TEOS), phosphorous-doped silicate glass (PSG) or any other suitable oxide material.

Figure 2:
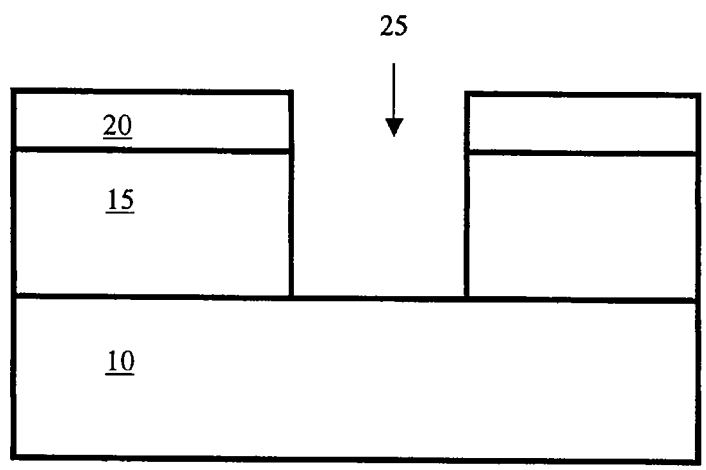
FIG. 2 illustrates the partially completed semiconductor device of FIG. 1 with an additional hard photoresist mask layer, as well as illustrating an etched contact hole according to an embodiment of the present invention.

FIG. 2 illustrates the partially completed semiconductor device of FIG. 1 with an additional hard photoresist mask layer 20 deposited on the oxide layer 15. The hard photoresist mask 20 comprises transparent amorphous carbon or any other suitable material known in the art. The preferred amorphous carbon layer is transparent in the visible light range and is formed with a thickness that does not substantially affect the reading of the alignment marks on the device to allow for the proper alignment and etching of the contact holes. The visible light range includes any light having a wavelength between about 400 nm and about 700 nm. The amorphous carbon layer has a substantially low absorption coefficient of between about 0.15 and about 0.001 at a wavelength of 633 nm.

The device comprising the substrate layer 10 and oxide layer 15 is placed in a plasma enhanced chemical vapor deposition (PECVD) chamber. The amorphous carbon hard photoresist mask layer 20 is then deposited over the oxide layer 15 in the PECVD chamber. The temperature of the chamber is set to range from about 200° C. to about 500° C. A process gas including propylene ($C_3H_6$) is introduced into the chamber at a flow rate of about 500 standard cubic centimeters per minute (sccm) to about 3000 sccm. An additional gas including helium may be introduced into the chamber at a rate of about 250 sccm to about 1000 sccm. At least one other hydrocarbon gas can be used in the process gas such as, for example $CH_4$, $C_2H_2$, $C_2H_4$, $C_2H_6$, and $C_3H_8$. Helium can also be used in combination with at least one these hydrocarbon gases. During the process, the chamber is subjected to a RF power and a pressure. The radio frequency is set between about 450 Watts and about 1000 Watts. The pressure can range from about 4 Torr to about 6.5 Torr. After removal from the PECVD chamber, the hard photoresist mask layer 20 is then patterned to define the active area landing regions for the contact holes 25 to be etched into the oxide layer 15.

The partially completed semiconductor device is illustrated in FIG. 2 as having a contact hole 25. The contact hole 25 is etched using a HARC plasma gas etch through the oxide layer 15 following the pattern defined on the hard photoresist mask 20 within a plasma gas processing chamber. The HARC etchants react with the material of the oxide layer 15 to etch the contact hole 25 into the oxide layer 15. The HARC etching substantially stops upon reaching the underlying substrate layer 10.

Figure 3:
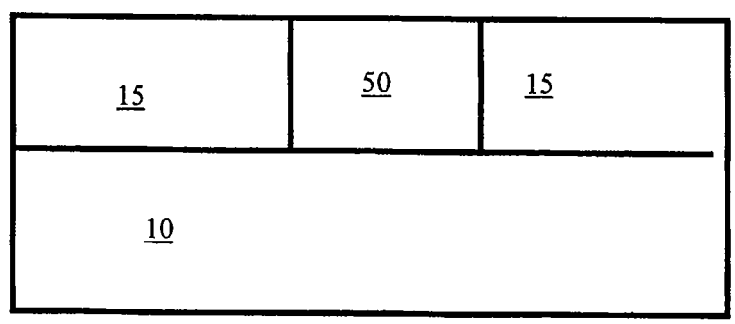
FIG. 3 illustrates the completed semiconductor device according to an embodiment of the present invention.
Figure 4:
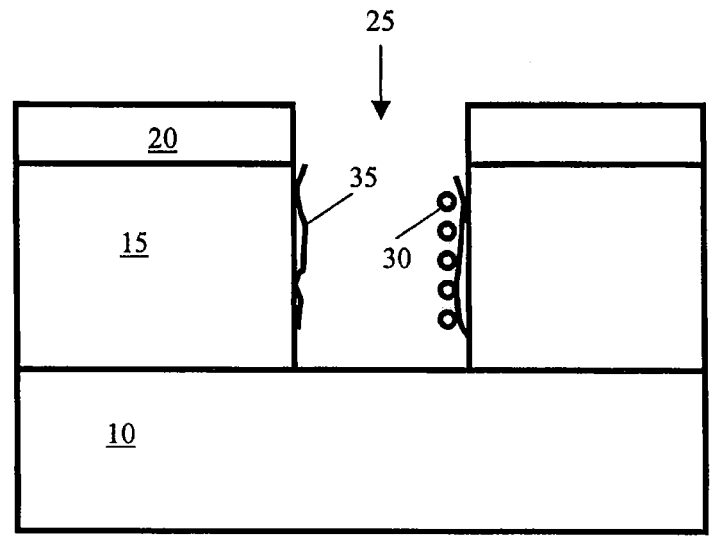
FIG. 4 schematically illustrates the polymer carbon chain buildup along the sidewalls of an etched contact hole.
Figure 5:
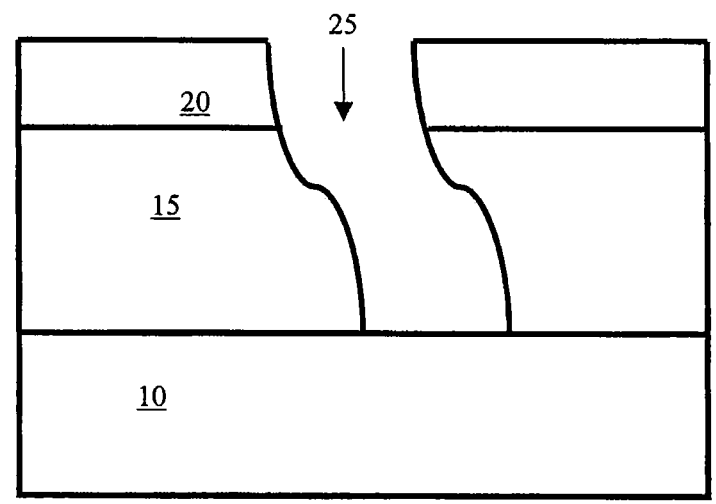
FIG. 5 illustrates the twisting of the contact hole resulting from the charge buildup along the polymer carbon chain that had been deposited along the sidewalls of an etched contact hole.

FIG. 4 illustrates a polymer carbon chain 35 that can build up and be deposited along the sidewalls of an etched contact hole 25 during HARC trench etching. The conductivity of sidewalls in the contact hole 25 is increased during the etching processes resulting in a charge buildup 30 on the polymer carbon chains 35 along the sidewalls of the contact hole 25. The source of the carbon atoms of the carbon chain polymer 35 may result from carbon in the hard photoresist mask 20, from carbon in the source plasma etching gases, or from carbon impurities in the oxide layer 15 itself. During a typical HARC trench etch, the charge buildup 30 along the sidewalls of the narrow and deep opening of the contact hole 25 can deflect the incoming etching ions causing changes in the trajectory of the ions. Such a changed trajectory results in the contact hole 25 twisting, or bending, away from a straight vertical position. An example of the twisting of the contact hole 25 is illustrated in FIG. 5. The hard photoresist mask 20 and carbon chain polymers 35 are then removed by dry stripping and wet cleaning. The contact hole 25 is then subsequently filled with a conductive metal material 50 to form a conductive path to the active area landing region on a underlying substrate 10 as illustrated in FIG. 3.

Figure 6:
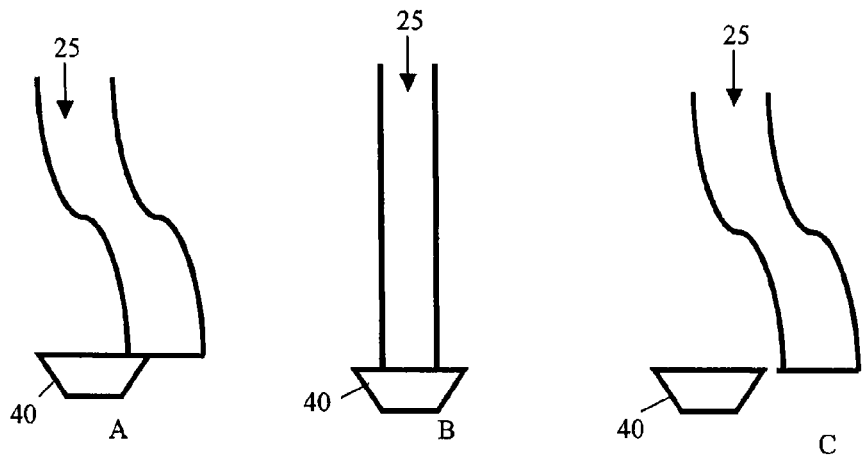
FIG. 6 illustrates the possible contact hole misalignments with the active area landing regions as a result of the twisting of the contact holes.

A non-vertical contact hole 25 can create many problems. FIG. 6 illustrates one such problem associated with contact hole 25 twisting. FIG. 6B illustrates the preferred alignment of the contact hole 25 with the active area landing region 40 in which there is no twisting of the contact hole 25 ensuring that the subsequently deposited conductive metal makes suitable contact with the active area landing region 40. FIG. 6A illustrates a twisted contact hole 25 that makes only partial contact with the active area landing region 40 resulting in an imperfect contact between the subsequently deposited conductive metal and the active area landing region 40. Finally, FIG. 6C illustrates a contact hole 25 that is so twisted that it completely misses the active area landing region 40. In FIG. 6C, no contact is made between the contact hole 25 and the active area landing region 40 resulting in the failure of the subsequently deposited conductive metal to make a suitable contact with the active area landing region 40.

Figure 7:
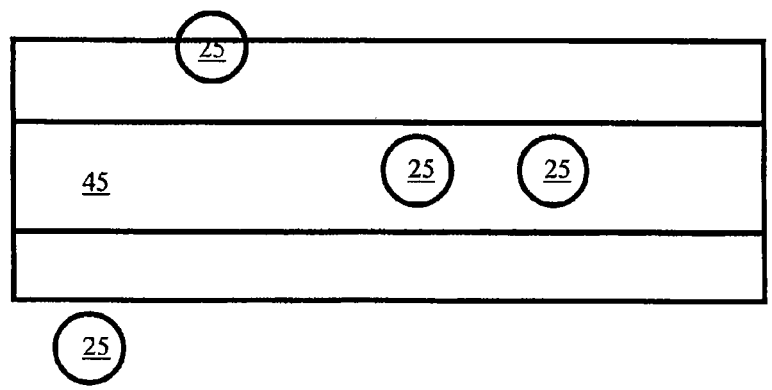
FIG. 7 illustrates an overhead view of the possible contact hole misalignments with the active area resulting from the twisting on the contact holes.

FIG. 7 provides another view of the problems associated with contact hole twisting. FIG. 7 illustrates an overhead view of the active area 45 and the importance of etching substantially vertical contact holes 25. When there is proper alignment and no twisting of the contact hole 25, the contact holes 25 are positioned within the active area 45. However, when twisting occurs, the contact holes 25 twist away from the active area 45 and subsequently fall outside the active area 45. These contact holes 25 do not make contact with the active area 45 when the contact holes 25 are subsequently filled with conductive metal.

The problems of contact hole twisting due to charge build up along the sidewalls associated with HARC plasma etching can be minimized by the addition of dopants in the form of atoms, molecules, and/or ions to the HARC plasma etching gas. The carbon chain polymers are doped with appropriate dopants such as iodine during the plasma gas etching of the contact holes. At least a portion of the dopants in the plasma etch stream lodge on the sidewalls and the carbon chain polymers that build up on the sidewalls. Doping the carbon chain polymers increases their conductivity and aids in bleeding off the charge build up along the carbon chain polymers. When the carbon chain polymer is conductive, it allows for dissipation of the charge into the plasma. By bleeding off the charge build up along the sidewalls, the incoming etching ions from the doped plasma etching gas will not be deflected, and the sidewalls of the contact hole will be substantially vertical.

The HARC plasma etching source gas is typically a hydrocarbon fluoride such as, for example, $CH_2F_2$, $C_4F_8$; $CHF_3$; $C_2F_6$, $C_2HF_5$; $CH_3F$; or $C_3H_3F_5$, $C_4F_8$ that has been mixed with oxygen gas. The dopants can be introduced into the HARC plasma etching gas as part of a molecule such as, for example, $H_1$ and $CH_3I$ in the case where iodine is the dopants. The dopants are introduced into the dry etch chamber during the HARC plasma gas etching. Other dopants, such as, for example carbon (C), potassium (K), calcium (Ca), phosphorus fluoride ($PF_6$), boron fluoride ($BF_3$), chloride (Cl) and arsenic fluoride ($AsF_6$) can also be used. The step coverage of the carbon chain polymer along the sidewalls is increased to better enable the charge bleed off. The doping level is carefully controlled in order to ensure that the etch component of the HARC plasma etching gas is not shut off. The dopants may be introduced intermittently, or pulsed, during the etch process.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A processing method that includes etching an opening in material which is over an underlying substrate, the method comprising:
    forming a mask having an opening therein over material which is over an underlying substrate;
    forming an etching plasma with gas comprising carbon and fluorine containing molecules;
    etching an opening into the material through the opening in the mask with the etching plasma, a carbon chain polymer building up on sidewalls of the opening during the etching, and increasing conductivity of the carbon chain polymer during the etching by addition of a component from the etching plasma to the carbon chain polymer, the added component comprising at least one of carbon, potassium, calcium, phosphorus, boron, chlorine, and arsenic provided within the etching plasma by a gas component other than the carbon and fluorine-containing molecules;
    removing the mask and the carbon polymer chain buildup; and
    filling the opening with conductive material after the removing.

2. The method of claim 1 wherein the gas from which the etching plasma is formed comprises oxygen.

3. The method of claim 1 wherein the added component comprises carbon.

4. The method of claim 1 wherein the added component comprises potassium.

5. The method of claim 1 wherein the added component comprises calcium.

6. The method of claim 1 wherein the added component comprises phosphorus.

7. The method of claim 6 wherein the gas component comprising phosphorus comprises $PF_6$.

8. The method of claim 1 wherein the added component comprises chlorine.

9. The method of claim 1 wherein the material comprise an oxide.

10. The method of claim 1 wherein the opening is etched to have substantially vertical sidewalls.

11. The method of claim 1 wherein the added component comprises boron.

12. The method of claim 11 wherein the gas component comprising boron comprises $BF_3$.

13. The method of claim 1 wherein the added component comprises arsenic.

14. The method of claim 13 wherein the gas component comprising arsenic comprises $AsF_6$.

15. The method of claim 1 wherein the etching is through the material to the underlying substrate.

16. The method of claim 15 comprising stopping the etching at the underlying substrate.

17. A method of etching an opening in material which is over an underlying substrate, the method comprising:
    forming a mask having an opening therein over material which is over an underlying substrate;
    forming an etching plasma with gas comprising carbon and fluorine-containing molecules; and
    etching an opening into the material through the opening in the mask with the etching plasma, a carbon chain polymer building up on sidewalls of the opening during the etching, and increasing conductivity of the carbon chain polymer during the etching by addition of a component from the etching plasma to the carbon chain polymer, the added component comprising at least one of carbon, potassium, calcium, phosphorus, boron, chlorine, and arsenic provided within the etching plasma by a gas component other than the carbon and fluorine-containing molecules, the gas component other than the carbon and fluorine-containing molecules being introduced into the etching plasma intermittently during the etching.

18. A method of etching an opening in material which is over an underlying substrate, the method comprising:
   forming a mask having an opening therein over material which is over an underlying substrate;
   forming an etching plasma with gas comprising carbon and fluorine-containing molecules; and
   etching an opening into the material through the opening in the mask with the etching plasma, a carbon chain polymer building up on sidewalls of the opening during the etching, and increasing conductivity of the carbon chain polymer during the etching by addition of a component from the etching plasma to the carbon chain polymer, the added component resulting from a gas component other than the carbon and fluorine-containing molecules that is introduced into the etching plasma intermittently during the etching.

* * * * *

UNITED STATES PATENT AND TRADEMARK OFFICE
CERTIFICATE OF CORRECTION

| | | |
|---|---|---|
| PATENT NO. | : 8,673,787 B2 | Page 1 of 1 |
| APPLICATION NO. | : 13/164970 | |
| DATED | : March 18, 2014 | |
| INVENTOR(S) | : Gurtej S. Sandhu et al. | |

It is certified that error appears in the above-identified patent and that said Letters Patent is hereby corrected as shown below:

In the claims

In column 6, line 8, in claim 1, delete "fluorine containing" and insert -- fluorine-containing --, therefor.

Signed and Sealed this
Fourth Day of November, 2014

Michelle K. Lee
*Deputy Director of the United States Patent and Trademark Office*